US011735447B2

United States Patent
Santhanam et al.

(10) Patent No.: US 11,735,447 B2
(45) Date of Patent: Aug. 22, 2023

(54) ENHANCED PROCESS AND HARDWARE ARCHITECTURE TO DETECT AND CORRECT REALTIME PRODUCT SUBSTRATES

(71) Applicant: Applied Materials, Inc., Santa Clara, CA (US)

(72) Inventors: Kartik Santhanam, Sunnyvale, CA (US); Kartik Shah, Saratoga, CA (US); Wolfgang Aderhold, Santa Clara, CA (US); Martin Hilkene, Gilroy, CA (US); Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 226 days.

(21) Appl. No.: 17/075,321

(22) Filed: Oct. 20, 2020

(65) Prior Publication Data
US 2022/0122865 A1    Apr. 21, 2022

(51) Int. Cl.
H01L 21/67 (2006.01)
G05B 19/406 (2006.01)
G06N 20/00 (2019.01)

(52) U.S. Cl.
CPC ...... H01L 21/67276 (2013.01); G05B 19/406 (2013.01); G06N 20/00 (2019.01); G05B 2219/45031 (2013.01)

(58) Field of Classification Search
CPC ............. G05B 19/404; G05B 19/406; G05B 2219/45031; G06N 20/00; H01L 21/67276
See application file for complete search history.

(56) References Cited

U.S. PATENT DOCUMENTS

| 2001/0051437 A1* | 12/2001 | Cruse ............... B81C 99/0065 156/345.28 |
| 2004/0254762 A1* | 12/2004 | Hopkins ........... H01L 21/67276 702/182 |
| 2005/0010318 A1* | 1/2005 | Lev-Ami ......... G05B 19/41875 700/109 |

(Continued)

FOREIGN PATENT DOCUMENTS

| EP | 0878842 | 11/1998 |
| JP | 2003-045846 | 2/2003 |

(Continued)

OTHER PUBLICATIONS

International Search Report and Written Opinion from Patent Application No. PCT/US2021/052708 dated Jan. 19, 2022, 10 pgs.

(Continued)

*Primary Examiner* — Kidest Bahta
(74) *Attorney, Agent, or Firm* — Schwabe, Williamson & Wyatt, P.C.

(57) ABSTRACT

Embodiments disclosed herein include a processing tool for semiconductor processing. In an embodiment, the processing tool comprises a chamber, and a plurality of witness sensors integrated with the chamber. In an embodiment, the processing tool further comprises a drift detection module. In an embodiment, data from the plurality of witness sensors is provided to the drift detection module as input data. In an embodiment, the processing tool further comprises a dashboard for displaying output data from the drift detection module.

20 Claims, 8 Drawing Sheets

(56) References Cited

U.S. PATENT DOCUMENTS

| | | | | |
|---|---|---|---|---|
| 2005/0204824 | A1* | 9/2005 | Goodman | F16K 37/0091 |
| | | | | 73/753 |
| 2007/0181192 | A1* | 8/2007 | Choi | G01F 25/15 |
| | | | | 73/40 |
| 2014/0332692 | A1* | 11/2014 | Lutz | H01L 31/022416 |
| | | | | 250/371 |
| 2017/0330109 | A1* | 11/2017 | Maughan | G06N 5/04 |
| 2018/0211823 | A1* | 7/2018 | Severin | H01J 37/3494 |
| 2018/0247798 | A1 | 8/2018 | Guha et al. | |

FOREIGN PATENT DOCUMENTS

| | | |
|---|---|---|
| KR | 10-0446926 B1 | 9/2004 |
| KR | 10-2006-0007388 | 1/2006 |

OTHER PUBLICATIONS

International Preliminary Report on Patentablity from Patent Application No. PCT/US2021/052708 dated May 4, 2023, 7 pgs.

* cited by examiner

ENHANCED PROCESS AND HARDWARE ARCHITECTURE TO DETECT AND CORRECT REALTIME PRODUCT SUBSTRATES

BACKGROUND

1) Field

Embodiments of the present disclosure pertain to the field of semiconductor processing and, in particular, to processing tool architectures that enable realtime process parameter drift detection and/or realtime corrections to mitigate process parameter drifts.

2) Description of Related Art

Semiconductor wafer processing has been increasing in complexity as semiconductor devices continue to progress to smaller feature sizes. A given process may include many different processing parameters (i.e., knobs) that can be individually controlled in order to provide a desired outcome on the wafer. For example, the desired outcome on the wafer may refer to a feature profile, a thickness of a layer, a chemical composition of a layer, or the like. As the number of knobs increase, the theoretical process space available to tune and optimize the process grows exceedingly large.

Additionally, once the final processing recipe has been developed, chamber drift during many iterations of the process for different wafers may result in changes to the outcome on the wafer. Chamber drift may be the result of erosion of consumable portions of the chamber, degradation of components (e.g., sensors, lamps, etc.), deposition of byproduct films over surfaces, or the like. Accordingly, additional tuning is needed even after the extensive recipe development process.

SUMMARY

Embodiments disclosed herein include a processing tool for semiconductor processing. In an embodiment, the processing tool comprises a chamber, and a plurality of witness sensors integrated with the chamber. In an embodiment, the processing tool further comprises a drift detection module. In an embodiment, data from the plurality of witness sensors is provided to the drift detection module as input data. In an embodiment, the processing tool further comprises a dashboard for displaying output data from the drift detection module.

Embodiments may also include a processing tool that comprises a physical tool. In an embodiment, the physical tool comprises control loop sensors, and witness sensors. In an embodiment, the processing tool may further comprise a drift detection module. In an embodiment, the drift detection module receives control loop sensor data and witness sensor data as inputs. In an embodiment, the drift detection module outputs process parameter data that indicates if one or more processing parameters have drifted.

Embodiments may also include a processing tool that comprises a physical tool. In an embodiment, the physical tool comprises a chamber, and a cartridge for flowing one or more processing gasses into the chamber from a plurality of gas sources. In an embodiment, the physical tool further comprises a mass flow controller for each of the plurality of gas sources, a mass flow meter between the gas sources and the cartridge, a first pressure gauge between the mass flow meter and the cartridge, a second pressure gauge fluidically coupled to the chamber, and an exhaust line coupled to the chamber. In an embodiment, the processing tool further comprises a drift detection module. In an embodiment, the drift detection module receives data from one or more of the mass flow controller, the mass flow meter, the first pressure gauge, and the second pressure gauge as inputs, and wherein the drift detection module outputs process parameter data.

DETAILED DESCRIPTION

Processing tool architectures that enable realtime process parameter drift detection and/or realtime corrections to mitigate process parameter drifts are described herein. In the following description, numerous specific details are set forth, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above, drift over the course of many iterations of a process in a processing tool is a common problem in the semiconductor manufacturing industry. Accordingly, embodiments disclosed herein include processing tools that include a drift detection module. In an embodiment, the drift detection module uses machine learning and/or hybrid models to detect when one or more processing parameter has drifted. Once drift is identified, a tool operator may adjust one or more tool settings in order to mitigate the drift. In an additional embodiment, the processing tool may further comprise a correction module. A correction module may utilize machine learning and/or a hybrid model to generate a control effort that is used to mitigate process drift. That is, the processing tool is able to automatically correct itself when drift occurs, instead of relying on the tool operator to make corrections. In yet another embodiment, a prediction module may be included in the processing tool. The prediction module may utilize machine learning and/or a hybrid model to predict the drifting of process parameters before they occur. In such an embodiment, the prediction module may provide a control effort to the processing tool in order to prevent the drift before it can occur.

Figure 1A:
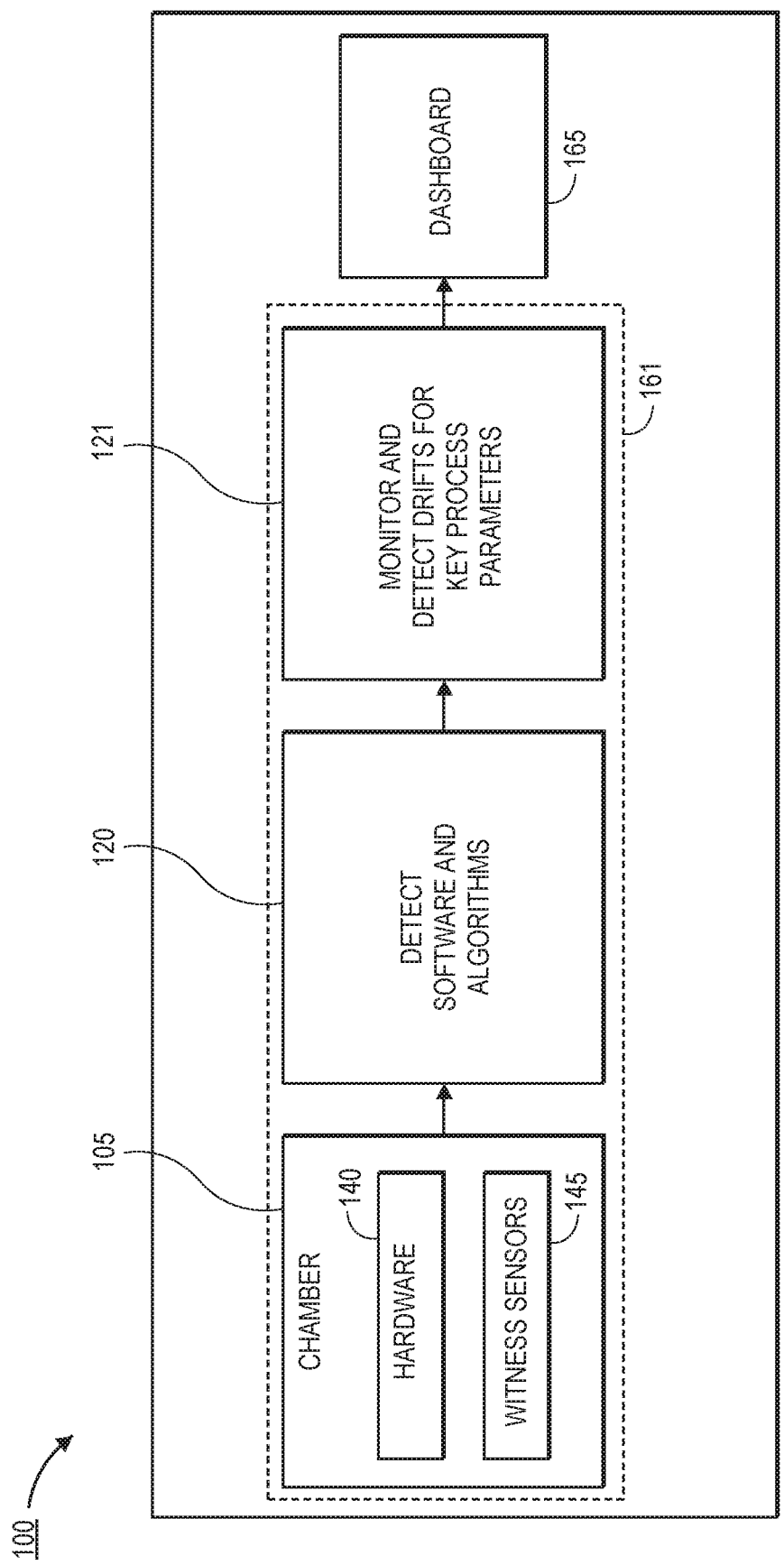
FIG. 1A is a schematic block diagram of a processing tool that comprises a drift detection module, in accordance with an embodiment.

Referring now to FIG. 1A, a schematic illustration of a processing tool 100 is shown, in accordance with an embodiment. In an embodiment, the processing tool 100 may comprise a detection module 161. The detection module 161 is used to identify drifting conditions within the processing tool 100. In an embodiment, the detection module 161 may comprise a chamber 105. The chamber 105 may be any chamber used for processing substrates, such as, but not limited to, wafers. For example, the wafers may have any suitable form factor (e.g., 300 mm, 450 mm, etc.). The wafers may be semiconductor wafers, such as silicon wafers, or group III-IV semiconductor materials. In other embodiments, the substrate may have a form factor other than standard wafer form factors.

The chamber 105 may be suitable for different types of processing operations. For example, the chamber 105 may be a lamp based chamber 105, a heater based chamber 105, or a plasma based chamber 105. In an embodiment, the chamber 105 may comprise chamber hardware 140. The hardware 140 may include, but is not limited to, the chamber itself, gas lines, valves, exhausts, lamps, pedestals, RF sources, and the like. In an embodiment, the hardware 140 may also include control loop sensors. Control loop sensors may be used to control process conditions within the chamber. For example, a control loop sensor may be used to set a desired pressure within the chamber 105.

In an embodiment, the chamber 105 may further comprise witness sensors 145. The witness sensors are outside of the control loop. As such, the witness sensors may be used to monitor the control loop sensors. As the control loop sensors drift, changes to witness sensor 145 outputs can be identified to alert the process engineer of drifting condition, even if the control loop sensors do not indicate any change in the process conditions.

In an embodiment, the detect module 161 may comprise a detect software and algorithms block 120, referred to as "detect block 120" for simplicity. The detect block 120 may comprise software and/or algorithms that utilize outputs from witness sensors 145 and/or control loop sensors to determine if the processing tool 100 is experiencing drift. For example, the outputs from the witness sensors 145 and/or the control loop sensors may be compared against a process fingerprint. If there is a difference between the expected values from the process fingerprint and the actual values obtained from the witness sensors and/or the control loop sensors, then it can be determined that process drift has occurred.

In an embodiment, the detect block 120 may generate the process fingerprint using machine learning algorithms and/or a hybrid model. A hybrid model may include a statistical model and a physical model. In an embodiment, the statistical model may be generated by implementing a physical design of experiment (DoE) and use interpolation to provide an expanded multidimensional process space model. In an embodiment, the physical model may be generated using real world physics and chemistry relationships. For example, physics and chemistry equations for various interactions within a processing chamber may be used to build the physical model. The combination of the statistical model and the physical model allows for the hybrid model to be a multidimensional model that is capable of mapping various tool settings to predicted outcomes (i.e., predicted process parameters). The predicted process parameters for a given set of tool settings may be considered the process fingerprint to which the outputs from the witness sensors 145 and/or control loop sensors are compared.

In an embodiment, the detect block 120 may output values 121 that are used to detect drifts for key process parameters of the process being implemented by the processing tool 100. For example, the output values 121 may include a difference between the process fingerprint and the outputs of the witness sensors and/or the control loop sensors. In an embodiment, the output values 121 may be provided to a dashboard 165. The dashboard 165 is a user interface that can be quickly reviewed by a process engineer in order to determine if drift is occurring in the processing tool 100. The dashboard 165 is described in greater detail below.

Figure 1B:
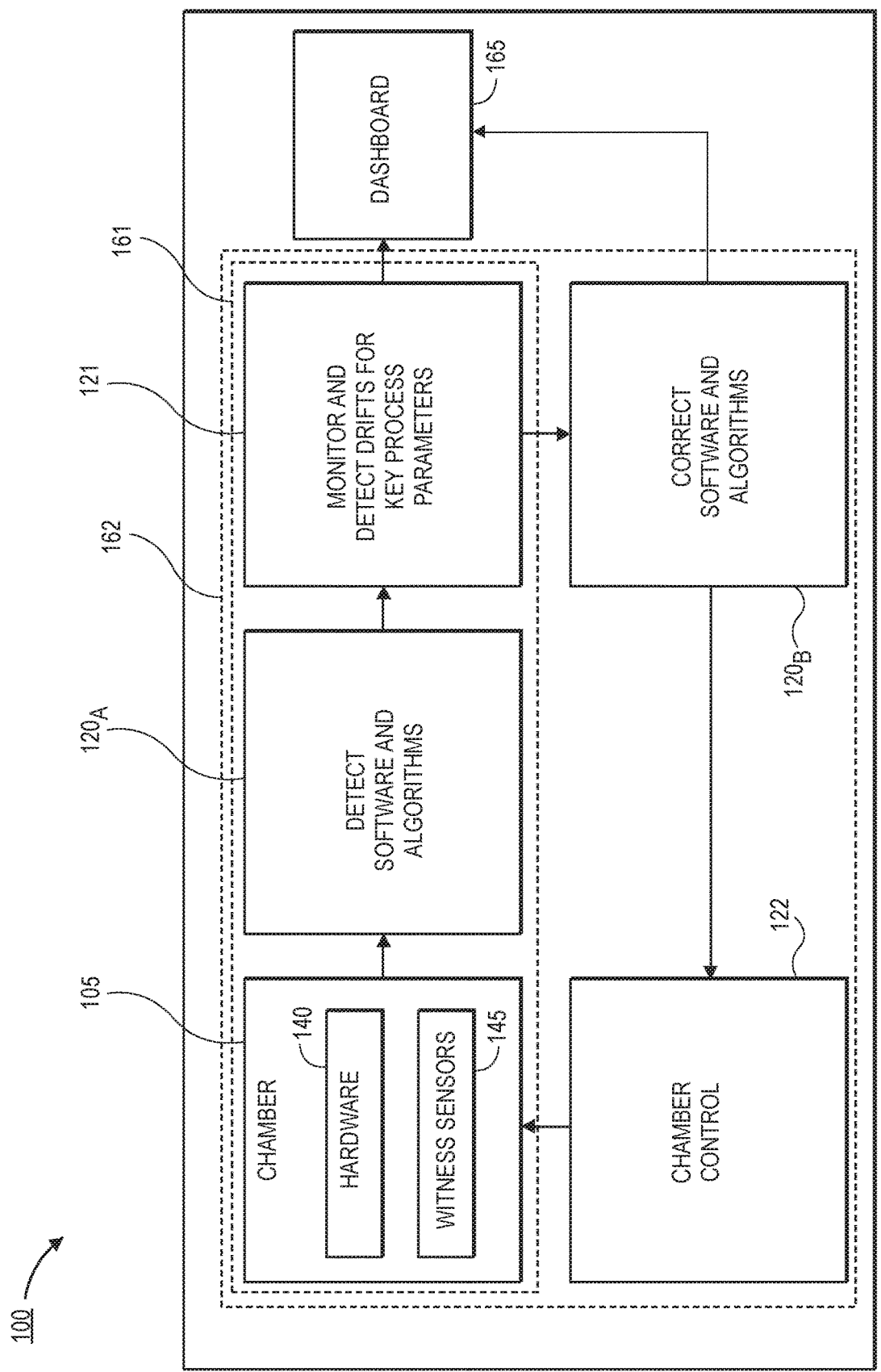
FIG. 1B is a schematic block diagram of a processing tool that comprises a drift detection module and a correction module, in accordance with an embodiment.

Referring now to FIG. 1B, a schematic block diagram of a processing tool 100 is shown, in accordance with an additional embodiment. The processing tool 100 may comprise a detect module 161 similar to the detect module 161 in FIG. 1A. In addition to the detect module 161, a correct module 162 is provided. The correct module 162 may comprise the detect module 161 and a correct software and algorithms block $120_B$, referred to as "correct block $120_B$" for short. The correct block $120_B$ may be similar to the detect block $120_A$ in that the correct block $120_B$ comprises machine learning algorithms and/or a hybrid model. The correct block $120_B$ takes the output values 121 from the detect block $120_A$ as inputs, and outputs a control effort to the chamber controller 122. The control effort may be determined by querying the multidimensional model in order to find tool settings that mitigate the drift detected by the detect block $120_A$. Accordingly, the drift of the processing tool 100 may be corrected without the need for intervention by a process engineer. However, data from the correct block $120_B$ may also be fed to the dashboard 165 to provide a visual indication of the changes that are being implemented to tool settings in the processing tool 100.

Figure 1C:
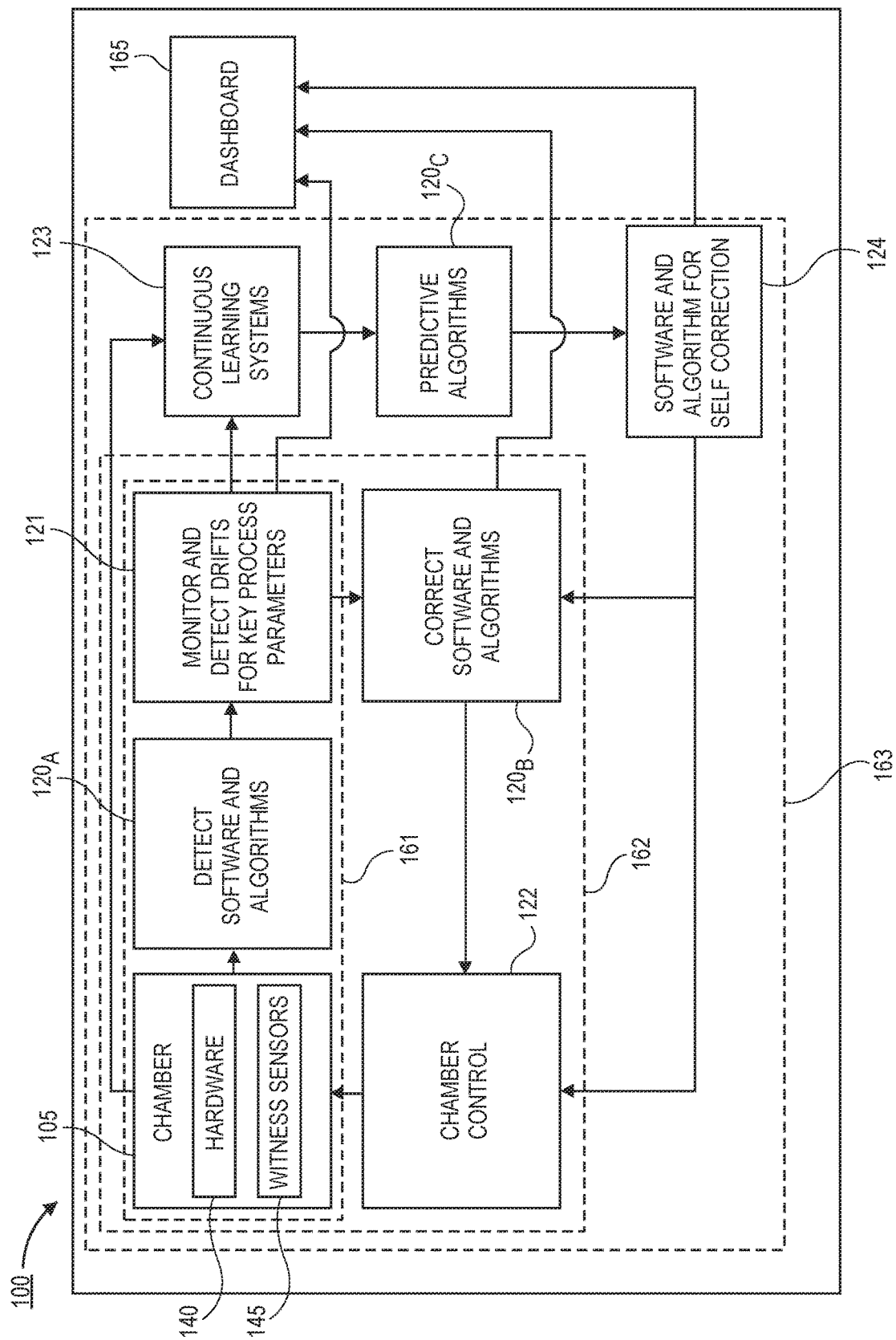
FIG. 1C is a schematic block diagram of a processing tool that comprises a drift detection module, a correction module, and a prediction module, in accordance with an embodiment.

Referring now to FIG. 1C, a schematic illustration of a processing tool 100 is shown, in accordance with an additional embodiment. The processing tool 100 may comprise a detect module 161 and a correct module 162, similar to the embodiment shown in FIG. 1B. The processing tool 100 may further comprise a predict module 163. The predict module 163 may comprise a continuous learning system 123, a predictive algorithm $120_C$ and software and/or an algorithm for self-correction 124.

In an embodiment, the continuous learning system 123 receives inputs from the sensors 145 of the chamber 105. In an embodiment, the continuous learning system 123 may also receive input data from output values 121 of the drift detection module 161. The continuous learning system 123 comprises machine learning or artificial intelligence that is used to categorize the type of drift that is predicted to occur. For example, the continuous learning system 123 may categorize whether the predicted drift will occur as a result of drifting conditions of one or more of the pump, lamps, or other changes to the chamber 105 hardware 140. The continuous learning system 123 learns, over time, how the chamber 105 reacts to variations in the readings of the sensors 145. That is, data is continuously fed into the continuous learning system 123 in order to develop a robust model capable of predicting the drift of one or more systems of the chamber 105.

In an embodiment, the continuous learning system 123 may provide output data that is fed to the predictive algorithms block $120_C$. The output data may include data identifying which system (or systems) is predicted to drift in the processing tool. In an embodiment, the predictive algorithms block $120_C$ may then be used to identify how long until one or more processing operations within the chamber 105 will exceed a threshold level. The threshold level comprises values above (or below) a setpoint which, when exceeded, result in a processing operation being out of specification. As such, drift outside of a given processing specification can be predicted before it occurs in addition to providing a timeframe until the drift exceeds a given threshold.

In an embodiment, the prediction algorithm block $120_C$ may then provide outputs to a self-correction algorithm 124. The self-correction algorithm 124 may provide control signals to the chamber control block 122. The chamber control block 122 provides adjustments to the hardware 140 in order to prevent the predicted drift. In some embodiments, the self-correction algorithm 124 may alternatively provide an output to the correct block $120_B$, and allow the correct block $120_B$ to generate the necessary control signal sent to the chamber control block 122 to accommodate for the predicted drift.

In addition to providing predictive control of drifts to on-substrate performance, the predict module 163 may also provide predictive maintenance of hardware 140 in the chamber 105. For example, the hardware 140 may include pumps, lamps, etc. Predictive maintenance can be used to identify when hardware 140 will fail or hardware 140 performance will degrade beyond a given threshold. In the case of predictive maintenance, the continuous learning systems 123 may analyze sensor data and its relation to hardware 140 failures in the chamber 105. That is, the continuous learning systems 123 is capable of identifying patterns in the sensor 145 data that correspond to the failure or degradation of a piece of hardware 140. For example, in the case of a pump failure, one or more of the sensors 145 may exhibit an excursion beyond a typical range, and the pump may subsequently fail a period of time after the excursion is detected.

After the continuous learning system has developed a model for the relationship between sensor data excursions and hardware 140 failure, the predictive algorithms block $120_C$ can look for the identified excursions in the data from the sensors 145. When a particular excursion has been found, the predictive algorithm block $120_C$ can provide an indication to the process engineer that hardware 140 failure will occur within a known period of time. As such the process engineer may initiate corrective maintenance to replace or repair that hardware 140 that is expected to fail before the failure occurs. As such, scrap is reduced since none of the substrates will be processed in a chamber 105 with faulty hardware.

In some embodiments, replacement or repair may not be necessary to correct the hardware. For example, an in-situ chamber clean may be sufficient to prevent the failure or damage of a piece of hardware. In such instances, the software and algorithm for self-correction 124 may provide a control signal to the chamber control 122 to initiate the needed maintenance.

Figure 2:
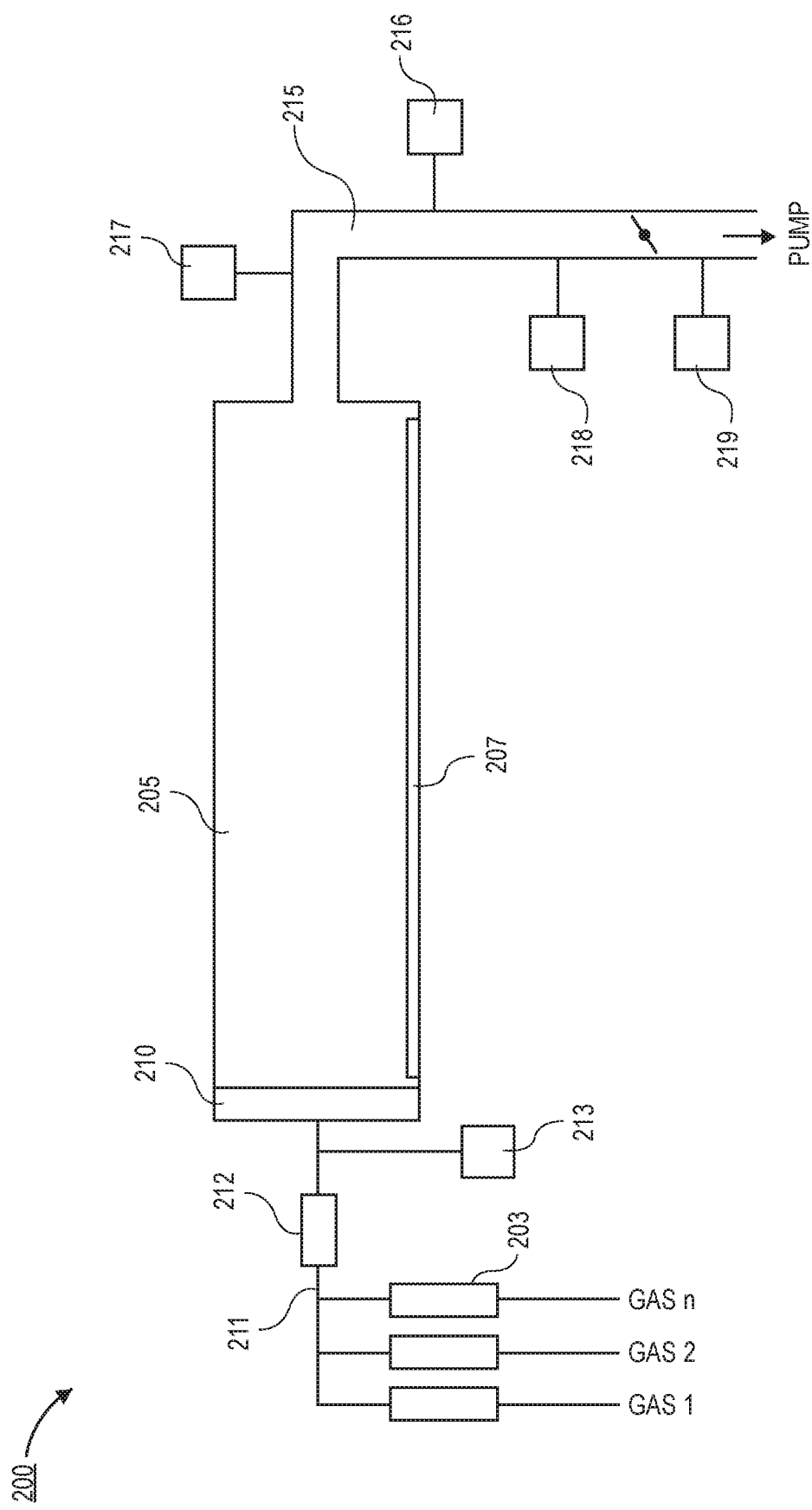
FIG. 2 is a schematic of a processing tool that comprises a plurality of witness sensors that are used to inform one or more of a drift detection module, a correction module, and a prediction module, in accordance with an embodiment.

Referring now to FIG. 2, a schematic illustrations of a processing tool 200 is shown, in accordance with an embodiment. The processing tool 200 illustrates the hardware components that may be utilized in one or more of the processing tools 100 described above with respect to FIGS. 1A-1C. In the illustrated embodiment, the processing tool 200 is described is a lamp based chamber for a radical oxidation process. However, it is to be appreciated that the processing tool 200 is exemplary in nature and embodiments disclosed herein may be suitable for use in conjunction with other processing tools, such as, but not limited to heater based chambers, or plasma based chambers. Those skilled in the art will recognize that the placement of sensors, the number of sensors, and the types of sensors may be modified in order to track desired processing parameters of the various types of processing tools.

In an embodiment, the processing tool 200 comprises a chamber 205. The chamber 205 may be a chamber suitable for providing a sub-atmospheric pressure in which a substrate (e.g., a semiconductor wafer) is processed. In an embodiment, the chamber 205 may be sized to accommodate a single substrate or a plurality of substrates. Semiconductor substrates suitable for processing in the chamber 205 may include silicon substrates, or any other semiconductor substrate. Other substrates, such as glass substrates, may also be processed in the chamber 205.

In an embodiment, a gas distribution network feeds gas from one or more gas sources (e.g., Gas 1, Gas 2, Gas n, etc.) to a cartridge 210. In a particular embodiment the gas sources may comprise one or more of oxygen, hydrogen, and nitrogen. While three gas sources are shown in FIG. 2A, it is to be appreciated that embodiments may include one or more gas sources. The cartridge 210 may include an inlet for receiving gas from line 211 and outlets for distributing the gas into the chamber 210. In the illustrated embodiment, the cartridge 210 is shown as feeding the gas into the chamber from a side of the chamber 210. However, it is to be appreciated that the cartridge 210 may optionally feed the gas into the chamber from above or below the chamber. In some embodiments, the cartridge 210 may also be referred to as a showerhead, particularly in cases where the processing tool is a plasma generating tool.

In an embodiment, the flow of each of the processing gasses may be controlled by separate mass flow controllers (MFCs) 203. In an embodiment, the MFCs 203 may be part of the control loop sensor group. The MFCs 203 control the flow of gas into a input line 211. In an embodiment, a mass flow meter (MFM) 212 is provided on the upstream side of the cartridge 210. The MFM 212 allows for the actual flow from the source gasses to be measured. Also included on the upstream side of the cartridge 210 is a pressure gauge 213. The pressure gauge 213 allows for the pressure of the input line 211 to be measured. The MFM 212 and the pressure gauge 213 may be considered witness sensors since they are outside of the control loop.

In an embodiment, a chamber pressure gauge 217 may be provided to measure a pressure in the chamber 205. The chamber pressure gauge 217 may be part of the control loop sensor group. In an embodiment, additional witness sensors are provided along an exhaust line 215 of the processing tool 200. The additional sensors may comprise a leak detection sensor 216 and additional pressure gauges 218 and 219. The leak detection sensor 216 may include a self-contained plasma optical emission spectroscopy (OES) device to measure oxygen that leaks into the chamber 205. The pressure gauges 218 and 219 may be on an upstream side and a downstream side of a throttle valve 214, respectively.

In an embodiment, the pressure gauges 213, 217, 218, and 219 may have operating ranges that are suitable for the typical pressures provided at the locations within the processing tool where they are located. For example, the pressure gauge 213 may operate at a pressure range that is higher than the pressure ranges of the other pressure gauges 217, 218, and 219. Similarly, the pressure gauge 218 may operate at a pressure range that is higher than the pressure range of the pressure gauge 219. In a particular embodiment, the pressure gauge 213 may operate at a range including 1,000T, the pressure gauge 217 may operate at a range including 20T, the pressure gauge 218 may operate at a range including 100T, and the pressure gauge 219 may operate at a range including 10T.

In an embodiment, the witness sensors (e.g., 212, 213, 216, 218, and 219) may be used to provide monitoring of chamber drift. For example, the control loop sensors (e.g., 203 and 217) may become miscalibrated during use of the processing tool 200. As such, the readings of the control loop sensors 203, 217 may remain constant while the outcome on the wafer (e.g., deposition rate of a film) changes. In such an instance, the outputs of the witness sensors will change to indicate that the chamber has drifted.

In an additional embodiment, the witness sensors may be leveraged to implement virtual sensors in the chamber 205. Virtual sensors may refer to a sensor that provides outputs that are computationally generated, as opposed to direct readings of a physical value (as is the case for physical sensors). Virtual sensors are therefore powerful for determining conditions within the processing tool 200 that are difficult or impossible to measure with conventional physical sensors.

In one embodiment, a virtual sensor may be used to determine a flow rate of processing gasses at the exit of the cartridge 210. Calculating the flow rate at the cartridge 210 is a valuable metric that can be used to control the deposition rate and/or deposition uniformity of a film on the wafer. In a particular embodiment, the flow rate at the cartridge 210 may be calculated using a Bernoulli equation with the variables supplied by using the outputs of the MFM 212, the pressure gauge 213, the pressure gauge 217, and the known geometry of the cartridge 210. While an example of flow rate at the cartridge is provided, it is to be appreciated that other unknowns within the processing tool 200 may be determined using virtual sensor calculations. For example, unknowns such as, but not limited to gas composition at various locations in a chamber, deposition rate across a wafer, pressure across a wafer, and film composition across a wafer may be determined using virtual sensor implementations.

In an embodiment, one or more temperature sensors 207 are provided in the chamber 205. For example, the temperature sensors 207 may be thermocouples or the like. In an embodiment, the temperature sensors 207 may be provided on a reflector plate (not shown) of the chamber. The temperature sensors 207 may be considered witness sensors in some embodiments. That is, the temperature sensors 207 may be outside of the control loop.

Temperature sensors 207 may provide an additional known variable to enable more extensive virtual sensor implementations. In an embodiment, the temperature sensors 207 may also be used in determining when a steady state has been reached in the chamber 205. This is particularly beneficial when bringing the processing tool 200 up from a cold state, such as ramping up the processing tool 200 after a maintenance event. For example, the output of the temperature sensors 207 in combination with one or more pressure gauges 213, 217, 218, and 219, and the angle of the throttle valve 214 may be monitored, and the chamber can be ready for use when a steady state of the various sensors is reached. In an embodiment, monitoring when the chamber reaches a steady state is useful because it eliminates the scrap or rework of wafers typically experienced due to first wafer effects in a processing tool.

Figure 3:
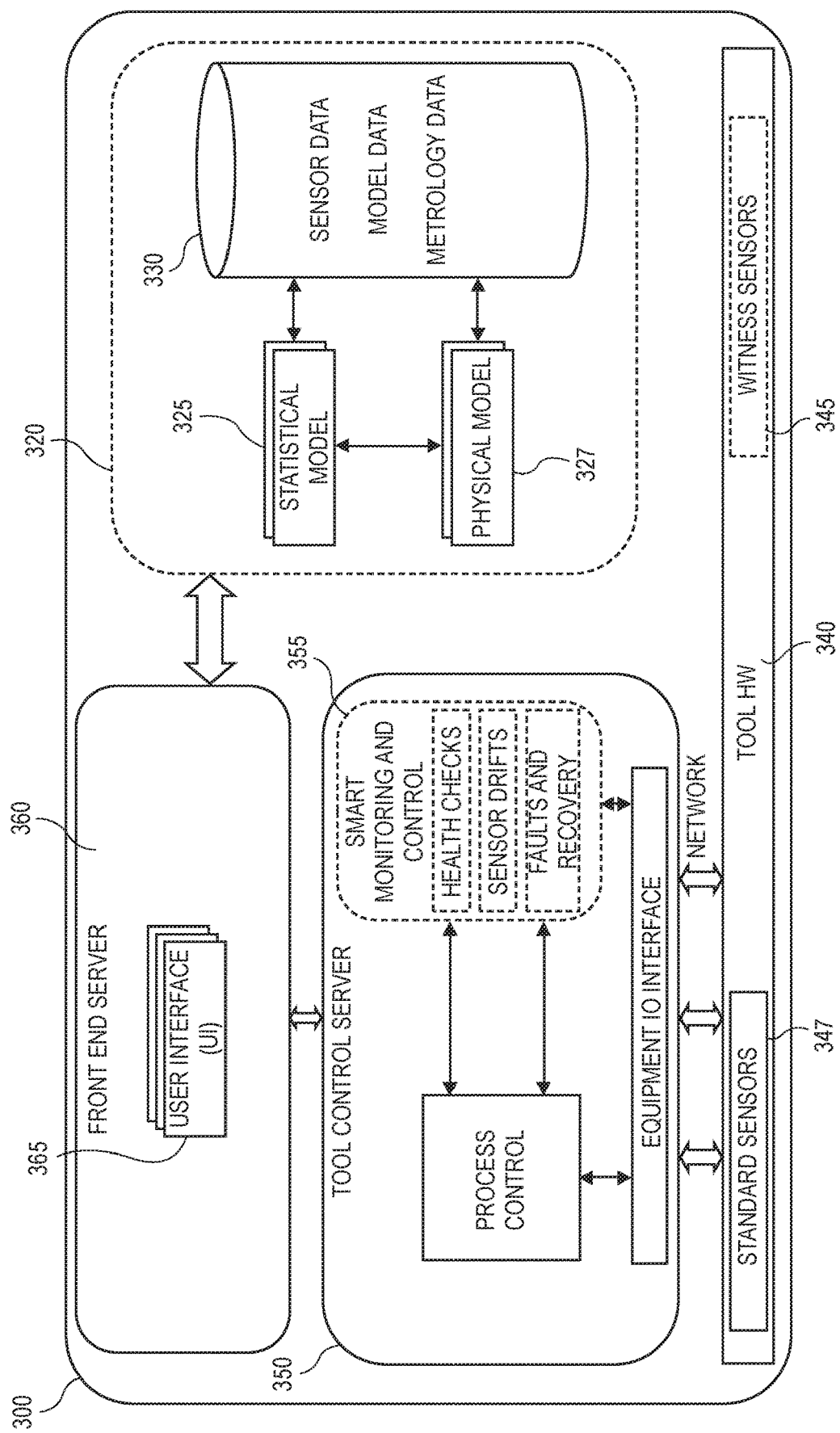
FIG. 3 is a block diagram of a processing tool that uses witness sensors and a hybrid data model to inform one or more of a drift detection module, a correction module, and a prediction module, in accordance with an embodiment.

Referring now to FIG. 3, a schematic of a processing tool 300 is shown, in accordance with an embodiment. As shown, an algorithm server 320 may be integrated with the processing tool 300. For example, the algorithm server 320 may be communicatively coupled to a front end server 360 by a network connection, as indicated by the arrow. However, in other embodiments, the algorithm server 320 may be external to the processing tool 300. For example, algorithm server 320 may be communicatively coupled to the processing tool 300 through an external network or the like.

In an embodiment, the algorithm server 320 may comprise one or more of the detect block 161, the correct block 162, and the predict block 163. That is, the algorithm server 320 may include machine learning and/or a hybrid model used to detect, correct, and/or predict drift of the processing tool 300. In the illustrated embodiment, the algorithm server 320 is shown as hosting a hybrid model. The hybrid model may comprise a physical model 327 and a statistical model 325. The statistical model 325 and the physical model 327 may be communicatively coupled to a database 330 for storing input data (e.g., sensor data, model data, metrology data, etc.) used to build and/or update the statistical model 325 and the physical model 327. In an embodiment, the statistical model 325 may be generated by implementing a physical DoE and use interpolation to provide an expanded process space model. In an embodiment, the physical model 327 may be generated using real world physics and chemistry relationships. For example, physics and chemistry equations for various interactions within a processing chamber may be used to build the physical model.

In an embodiment, the processing tool 300 may comprise a front end server 360, a tool control server 350, and tool hardware 340. The front end server 360 may comprise a dashboard 365 for the algorithm server 320. The dashboard 365 provides an interface for a process engineer to utilize the data modeling in order to execute various operations, such as drift monitoring, drift correction, and drift prediction.

The tool control server 350 may comprise a smart monitoring and control block 355. The smart monitoring and control block 355 may comprise modules for providing diagnostics and other monitoring of the processing tool 300. Modules may include, but are not limited to health checks, sensor drift, fault recovery, and leak detection. The smart monitoring and control block 355 may receive data from various sensors implemented in the tool hardware as inputs. The sensors may include standard sensors 347 that are generally present in semiconductor manufacturing tools 300 to allow for operation of the tool 300. For example, the sensors 347 may include control loop sensors such as those described above. The sensors may also include witness sensors 345 that are added into the tool 300. The witness sensors 345 provide additional information that is necessary for the building of highly detailed data models. For example, the witness sensors may include physical sensors and/or virtual sensors. As noted above, virtual sensors may utilize the data obtained from two or more physical sensors and use calculations in order to provide additional sensor data not obtainable from physical sensors alone. In a particular example, a virtual sensor may utilize an upstream pressure sensor and a downstream pressure sensor in order to calculate a flow rate through a portion of the processing tool, such as a gas cartridge. Generally, witness sensors may include any type of sensor, such as, but not limited to, pressure sensors, temperature sensors, and gas concentration sensors.

In an embodiment, the smart monitoring and control block 355 may provide data that is used by the algorithm server 320. In other embodiments, output data from the various witness sensors 345 may be provided directly to the algorithm server 320.

Figure 4A:
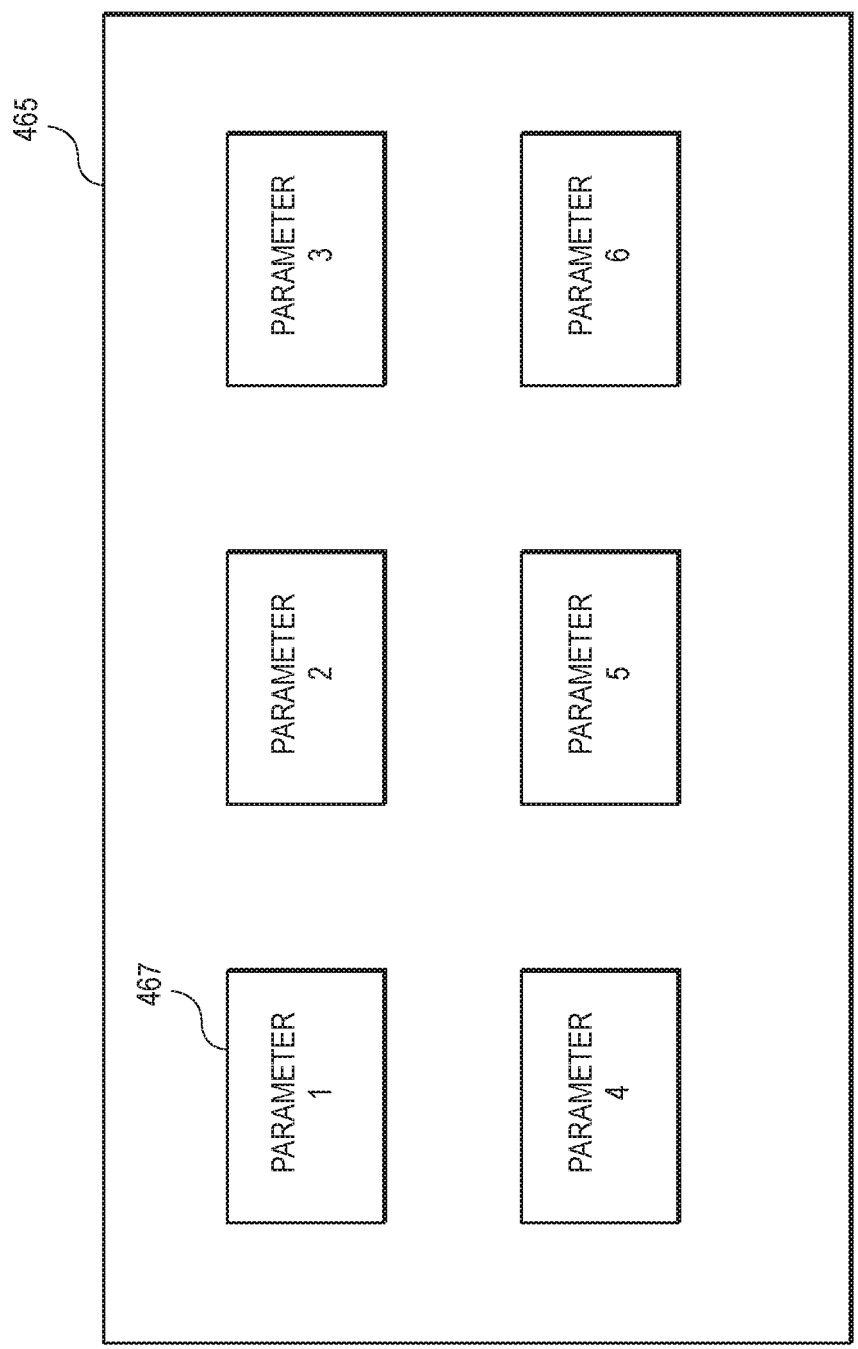
FIG. 4A is a dashboard that is presented to a user of the processing tool that provides an information regarding one or more processing parameters of the processing tool, in accordance with an embodiment.

Referring now to FIG. 4A, a schematic illustration of a dashboard 465 is shown, in accordance with an embodiment. As shown, the dashboard 465 may comprise a plurality of different parameters $467_{1-n}$ of the processing tool that may be monitored with one or more of the detect block, the correct block, and the predict block. The parameters 467 displayed on the dashboard 465 may be key parameters for the processing operation that is being monitored. For example, in a lamp based chamber, the key parameters 467 may include one or more of a gas flow rate, a pressure, a temperature, deposition characteristics, a coating amount on the chamber walls, and a leak detection. In the case of a heater based chamber, the key parameters 467 may include one or more of a pressure, a temperature, deposition characteristics, a coating amount on the chamber walls, and radical densities. In the case of a plasma based chamber, the key parameters 467 may include a gas flow rate, a pressure, a plasma density, a leak detection, a temperature, RF parameters, and a coating amount on the chamber walls.

In an embodiment, the parameters 467 may provide a visual status indicator. For example, a green dot, a yellow dot, or a red dot may be displayed to provide a general indication of the status of the given parameter. That is, a green dot may indicate that the process is operating without drift, a yellow dot may indicate the process is moving away from a desired operating range, and a red dot may indicate that the process has drifted beyond a predetermined range. However, it is to be appreciated that any visual mechanism (with any desired resolution) may be used to provide a simple indication of drift.

Figure 4B:
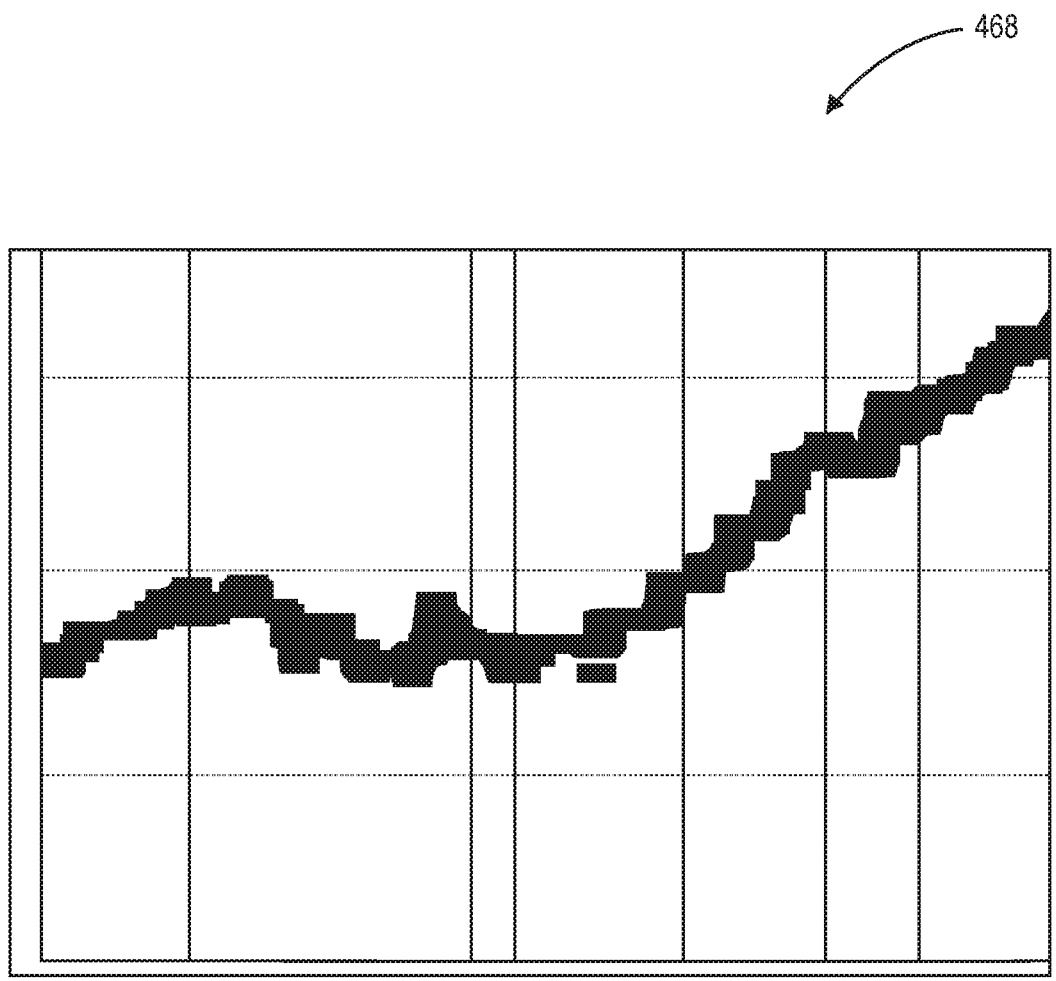
FIG. 4B is a statistical process control chart of one of the processing parameters in FIG. 4A, in accordance with an embodiment.

The dashboard 465 may also supply additional information about a given parameter 467. For example, one of the parameters 467 may be clicked by the process engineer to bring up additional information. For example, FIG. 4B is an illustration of a statistical process control (SPC) chart 468 of a given parameter 467. Each point on the SPC chart 468 may be a representation of a wafer or substrate that has been processed by the processing tool. In an embodiment, the most recently processed wafers are shown (e.g., the past 100 wafers). However, it is to be appreciated that the history displayed in the SPC chart 468 may include any number of wafers. The ability to track each of the wafers provides improved monitoring of drift compared to existing methods. For example, existing methods rely on physical metrology in order to populate an SPC chart. This requires additional resources and time, and typically cannot be implemented for each wafer or substrate.

The SPC chart 468 may be used to visually indicate when a process is starting to drift. As shown in FIG. 4B, the points are trending up. This may indicate that drift of that processing parameter is occurring, and that subsequently processed wafers are in danger of being out of specification. Similarly, if the points were trending down, drift may also be occurring. In some embodiments, individual points on the SPC chart may be clicked to provide further detail of an individual substrate. For example, charts of uniformity data on a given substrate or wafer may be provided in some embodiments.

Figure 5:
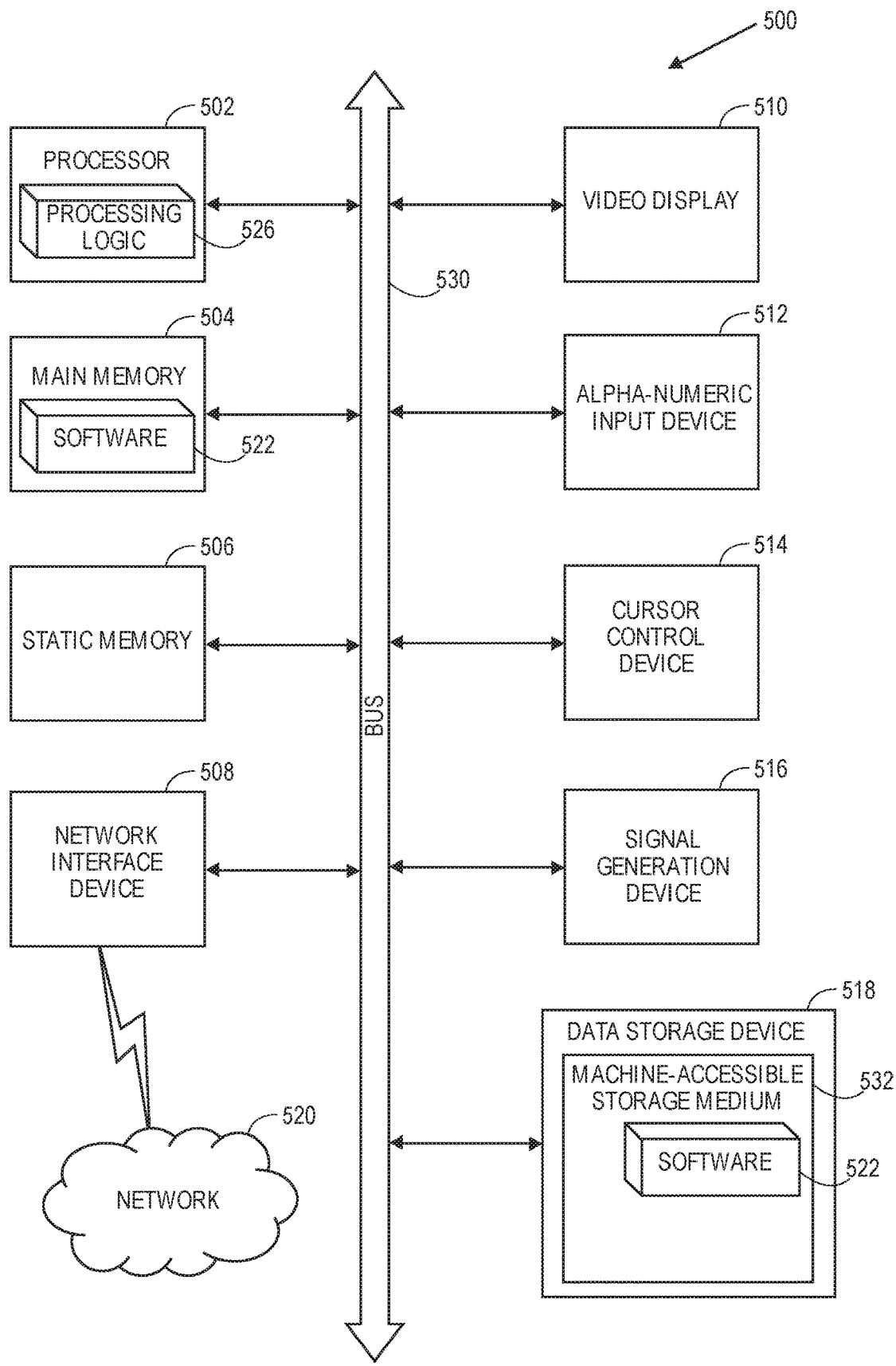
FIG. 5 illustrates a block diagram of an exemplary computer system, in accordance with an embodiment of the present disclosure.

FIG. 5 illustrates a diagrammatic representation of a machine in the exemplary form of a computer system 500 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), MRAM, etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations described herein.

The computer system 500 may further include a network interface device 508. The computer system 500 also may include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 532 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a methods of monitoring drift, correcting for drift, and/or predicting drift in a processing tool.

Thus, methods and apparatuses for monitoring drift, correcting for drift, and/or predicting drift in a processing tool have been disclosed.

What is claimed is:

1. A processing tool, comprising:
   a chamber;
   a mass flow controller coupled to the chamber;
   a mass flow meter coupled to the chamber;
   a pressure gauge coupled to the chamber;
   a plurality of witness sensors integrated with the chamber;
   a drift detection module, wherein data from the plurality of witness sensors is provided to the drift detection module as input data from one or both of the mass flow controller or the mass flow meter; and
   a dashboard for displaying output data from the drift detection module.

2. The processing tool of claim 1, wherein the drift detection module utilizes machine learning algorithms to process the input data from the plurality of witness sensors.

3. The processing tool of claim 1, wherein the drift detection monitor utilizes a hybrid model to process the input data from the plurality of witness sensors.

4. The processing tool of claim 3, wherein the hybrid model comprises a physical model and a statistical model.

5. The processing tool of claim 1, wherein the output data from the drift detection module comprises a statistical process control (SPC) chart.

6. The processing tool of claim 1, further comprising:
   a process correction module.

7. The processing tool of claim 6, wherein the process correction module comprises:
   a correction algorithm, wherein the output data from the drift detection module is fed into the correction algorithm as an input, and wherein an output from the correction algorithm is a control effort; and
   a chamber control interface, wherein the control effort induces the chamber control interface to change one or more tool settings of the processing tool.

8. The processing tool of claim 7, further comprising:
   a process prediction module.

9. The processing tool of claim 8, wherein the process prediction module comprises:
   a continuous learning system;
   a predictive algorithm; and
   a self-correction module.

10. The processing tool of claim 1, wherein the chamber is a lamp based chamber.

11. The processing tool of claim 10, wherein the output data from the drift detection module includes one or more process parameters, wherein the one or more process parameters comprise one or more of a gas flow rate, a pressure, a temperature, a deposition characteristic, a coating amount on chamber walls, and a leak detection.

12. The processing tool of claim 1, wherein the chamber is a heater based chamber.

13. The processing tool of claim 12, wherein the output data from the drift detection module includes one or more process parameters, wherein the one or more process parameters comprise one or more of a pressure, a temperature, a deposition characteristic, a coating amount on chamber walls, and a radical density.

14. The processing tool of claim 1, wherein the chamber is a plasma based chamber.

15. The processing tool of claim 14, wherein the output from the drift detection module includes one or more process parameters, wherein the one or more process parameters comprise one or more of a gas flow rate, a pressure, a plasma density, a leak detection, a temperature, an RF parameter, and a coating amount on chamber walls.

16. A processing tool, comprising:
   a physical tool, wherein the physical tool comprises:
      a chamber;
      a mass flow controller coupled to the chamber;
      a mass flow meter coupled to the chamber;
      a pressure gauge coupled to the chamber;
      control loop sensors; and
      witness sensors;
   a drift detection module, wherein the drift detection module receives control loop sensor data and witness sensor data as inputs from one or both of the mass flow controller or the mass flow meter, and wherein the drift detection module outputs process parameter data that indicates if one or more processing parameters have drifted.

17. The processing tool of claim 16, further comprising:
   a process correction module, wherein the process correction module receives the process parameter data as inputs and outputs a control effort to change one or more of the tool settings of the physical tool.

18. The processing tool of claim 17, further comprising:
   a drift prediction module, wherein the drift prediction module receives the control loop sensor data and the witness sensor data as inputs, and wherein the drift prediction module outputs prediction data that indicates when the physical tool will operate outside of a threshold value.

19. A processing tool, comprising:
   a physical tool, comprising:
      a chamber;
      a cartridge for flowing one or more processing gasses into the chamber from a plurality of gas sources;
      a mass flow controller for each of the plurality of gas sources;
      a mass flow meter between the gas sources and the cartridge;
      a first pressure gauge between the mass flow meter and the cartridge;
      a second pressure gauge fluidically coupled to the chamber; and
      an exhaust line coupled to the chamber;
   a drift detection module, wherein the drift detection module receives data from one or more of the mass flow controller, the mass flow meter, the first pressure gauge, and the second pressure gauge as inputs, and wherein the drift detection module outputs process parameter data.

20. The processing tool of claim 19, wherein the drift detection module comprises one or both of a hybrid model comprising a physical model and a statistical model, and a machine learning module.

* * * * *